United States Patent
Wang et al.

(10) Patent No.: US 7,915,902 B2
(45) Date of Patent: Mar. 29, 2011

(54) DYNAMIC BURN-IN SYSTEMS AND APPARATUSES

(75) Inventors: Dongming Wang, Shanghai (CN); Jun Wen, Shanghai (CN); Kenneth Chew, Singapore (SG)

(73) Assignee: Mongtage Technology Group Limited, George Town, Grand Cayman (KY)

( * ) Notice: Subject to any disclaimer, the term of this patent is extended or adjusted under 35 U.S.C. 154(b) by 722 days.

(21) Appl. No.: 11/550,728

(22) Filed: Oct. 18, 2006

(65) Prior Publication Data
US 2008/0094091 A1    Apr. 24, 2008

(51) Int. Cl.
*G01R 31/10* (2006.01)
*G01R 31/26* (2006.01)

(52) U.S. Cl. .............. 324/750.05; 324/762.01
(58) Field of Classification Search ............ 324/158.1, 324/760, 765
See application file for complete search history.

(56) References Cited

U.S. PATENT DOCUMENTS

| | | | |
|---|---|---|---|
| 4,926,116 A * | 5/1990 | Talisa | 324/117 R |
| 5,341,096 A * | 8/1994 | Yamamura | 324/765 |
| 5,625,288 A * | 4/1997 | Snyder et al. | 324/158.1 |
| 5,701,087 A * | 12/1997 | Takano | 324/765 |
| 5,798,653 A | 8/1998 | Leung, Jr. | |
| 5,999,007 A * | 12/1999 | Kimura | 324/760 |
| 6,118,284 A * | 9/2000 | Ghoshal et al. | 324/750 |
| 6,119,255 A * | 9/2000 | Akram | 714/724 |
| 6,357,025 B1 * | 3/2002 | Tuttle | 714/724 |
| 6,566,900 B2 * | 5/2003 | Amick et al. | 324/760 |
| 6,586,924 B1 * | 7/2003 | Okayasu et al. | 324/158.1 |
| 6,809,542 B2 * | 10/2004 | Dorman | 324/765 |
| 6,876,185 B2 * | 4/2005 | Niratsuka | 324/76.53 |
| 7,023,228 B2 | 4/2006 | Maesaki et al. | |
| 7,078,913 B1 | 7/2006 | Pelletier | |
| 7,274,194 B1 * | 9/2007 | Anderson et al. | 324/522 |
| 7,345,495 B2 * | 3/2008 | Dangelo et al. | 324/760 |
| 7,449,904 B2 * | 11/2008 | Pullen et al. | 324/750.06 |
| 2002/0105355 A1 | 8/2002 | Floyd | |
| 2004/0169524 A1 * | 9/2004 | Maesaki et al. | 324/765 |
| 2005/0099197 A1 * | 5/2005 | Maesaki et al. | 324/760 |

OTHER PUBLICATIONS (Lim at a1) EEE Microwave and Wireless Components Letters. vol. 11, Unequal Wllkinnson Power Divider Nov. 3, 2001 entire document.
Jong-Sik Lim, Sung-Won Lee, Chul-Soo Kim, et al, "A 4 : 1 Unequal Wilkinson Power Divider", IEEE Microwave and Wireless Components Letters, vol. 11, No. 3, Mar. 2001.

* cited by examiner

*Primary Examiner* — Ha Tran T Nguyen
*Assistant Examiner* — Joshua Benitez
(74) *Attorney, Agent, or Firm* — Ivy Mei

(57) ABSTRACT

A burn-in apparatus with a radio frequency signal generator is provided. One embodiment includes a printed circuit board to carry a plurality of semiconductor devices for a burn-in process and a radio frequency signal generator mounted on the printed circuit board to provide a plurality of radio frequency signals to the plurality of semiconductor devices respectively during the burn-in process of the plurality of semiconductor devices.

20 Claims, 6 Drawing Sheets

DYNAMIC BURN-IN SYSTEMS AND APPARATUSES

FIELD OF THE TECHNOLOGY

At least some embodiments of the invention relate to dynamic burn-in tests of semiconductor devices.

BACKGROUND

Burn-in systems have been used to increase the reliability of Integrated Circuit (IC) products. A fresh IC from a fabrication process may function properly initially but fail after a short period of operation, due to, for example, a metal wire within the IC that is too irregular or too thin to carry changing electrical current without significant damaging effects such as electron migration or localized heating. A burn-in process subjects the semiconductor devices, such as IC chips, to age-accelerating stress to weed out the IC chips that would fail early. It could be very expensive if such early failures occurred during the actual use of an IC in a system, in terms of user satisfaction and the cost to replace the failed IC in the system. It's much more cost-effective to catch those early failures before the ICs are delivered to customers and assembled into systems. A burn-in process can drive such IC chips into failure, preventing them from being assembled into the system to cause early failure in delivered products. Further, a prolonged burn-in test of samples of a batch of ICs can be used to estimate the life expectancy of the ICs and the reliability of the ICs.

A burn-in process may subject the semiconductor devices to extreme operating conditions, such as heat, high operating voltages, high humidity, etc., in a burn-in chamber (e.g., a burn-in oven). Circuit boards (burn-in boards) are used to hold the semiconductor devices in the burn-in chamber; and power and clock signals are provided to the semiconductor devices via the burn-in boards. Wires are used to supply power and clock signals to the burn-in boards. The power and clock signals may be provided by a driver board that is located outside the burn-in chamber.

In a static burn-in oven, the input pins of the ICs are not given any input stimuli. In such a static burn-in system, a large portion of the circuit nodes of a complex IC are not toggle due to the constant signals for the input pins.

In a dynamic burn-in oven, the input pins of the ICs are provided with varying input. When carefully designed, the changing input stimuli provided to the input pins of the ICs can fully exercise at least the majority of the circuit nodes of a complex IC. In some ICs, such as Complementary Metal Oxide Semiconductor (CMOS) based ICs, the circuit draws more current and consumes more power when the states of the circuit nodes are toggled. Thus, a dynamic burn-in oven can burn in the ICs more effectively than a static burn-in oven. Currently, it is difficult to achieve real dynamic life testing for most of mixed-signal and RF ICs which have analog and/or RF parts.

A dynamic burn-in system includes an input generator, which may be located outside of the burn-in oven, or inside the burn-in oven. For example, U.S. Pat. No. 5,798,653, entitled "Burn-in System for Reliable Integrated Circuit Manufacturing", describes a dynamic burn-in system in which a burn-in controller IC is used inside the burn-in oven to generate digital stimuli for the input pins of the ICs that are subject to the burn-in process.

An Arbitrary Waveform Generator (AWG) is often used as the input signal generator for a dynamic burn-in process. Because AWGs synthesize the waveforms using digital signal processing techniques, their maximum frequency is usually limited to no more than 20 Megahertz.

SUMMARY OF THE DESCRIPTION

A burn-in apparatus with a radio frequency signal generator is described here. Some embodiments are summarized in this section.

One embodiment includes a printed circuit board to carry a plurality of semiconductor devices for a burn-in process and a radio frequency signal generator mounted on the printed circuit board to provide a plurality of radio frequency signals to the plurality of semiconductor devices respectively during the burn-in process of the plurality of semiconductor devices.

In one embodiment, the radio frequency signal generator includes a Wilkinson power divider.

In one embodiment, the radio frequency signal generator further includes a voltage controlled oscillator.

In one embodiment, the voltage controlled oscillator is controllable according to an input signal to adjust frequency of the radio frequency signal.

In one embodiment, the Wilkinson power divider splits a radio frequency signal generated by the voltage controlled oscillator into the plurality of radio frequency signals. The radio frequency signal generator further includes an attenuation network; the attenuation network attenuates a radio frequency signal received from the voltage controlled oscillator to provide an attenuated radio frequency signal to the Wilkinson power divider.

In one embodiment, the plurality of radio frequency signals have equal power.

In one embodiment, the radio frequency signal generator includes a port to receive a radio frequency signal; and the Wilkinson power divider splits the radio frequency signal received from the port into the plurality of radio frequency signals.

In one embodiment, the radio frequency signal generator further includes an attenuation network; the attenuation network provides an attenuated radio frequency signal to the Wilkinson power divider.

In one embodiment, the attenuation network is controllable according to an input signal to adjust amplitude of the attenuated radio frequency signal.

In one embodiment, the plurality of semiconductor devices include a plurality of integrated circuits; and the printed circuit board include a plurality of sockets to receive the plurality of integrated circuits.

One embodiment includes an apparatus including a printed circuit board to carry a plurality of semiconductor devices for a burn-in process; and a power divider mounted on the printed circuit board, the power divider to split an analog signal into a plurality of analog input signals for the plurality of semiconductor devices during the burn-in process of the plurality of semiconductor devices.

In one embodiment, the analog signal has a frequency above 100 Megahertz.

In one embodiment, power divider is an equal Wilkinson power divider.

In one embodiment, the apparatus includes a voltage controlled oscillator (VCO) based signal generator mounted on the printed circuit board to generate the analog signal.

In one embodiment, at least one of frequency and amplitude of the analog signal is controllable via one or more digital signals.

One embodiment includes an apparatus including a printed circuit board to carry a plurality of semiconductor devices for a burn-in process; and a voltage controlled oscillator (VCO)

mounted on the printed circuit board to provide an analog signal during the burn-in process of the plurality of semiconductor devices.

In one embodiment, the analog signal has a frequency above 500 Megahertz or up to several Gigahertz.

One embodiment includes an apparatus further including a Wilkinson power divider to divide the analog signal for inputting to the plurality of semiconductor devices.

In one embodiment, each of the semiconductor devices includes an integrated circuit (IC).

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION OF THE INVENTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

Some Integrate Circuits (ICs) have been developed with the capability to process analog signals and/or high frequency signals, such as Radio Frequency (RF) ICs. To fully exercise such ICs in a dynamic burn-in process, it is desirable to provide the ICs with analog signals and/or high frequency input signals.

One embodiment of the invention uses a signal source and distribution network on the burn-in board to provide high-frequency inputs for RF/mixed-signal Integrated Circuits (ICs) that are under test in the burn-in process. Thus, dynamic burn-in test for RF/mixed-signal ICs can be implemented in a flexible and cost-effective way.

In one embodiment, an RF VCO (Voltage Controlled Oscillator) and a power splitter are implemented on the burn-in board to generate RF signals for the Devices under Test (DUTs). The on-board RF VCO and the power splitter is designed to provide RF inputs that meets frequency (e.g., above 100 or 500 Megahertz, up to several Gigahertz) and impedance requirements for dynamic burn-in test of RF ICs. Using the continuous RF signal supply and digital input patterns, one can design a dynamic burn-in process which toggles the RF IC's internal transistors in both RF receiver part and digital processing part.

Figure 1:
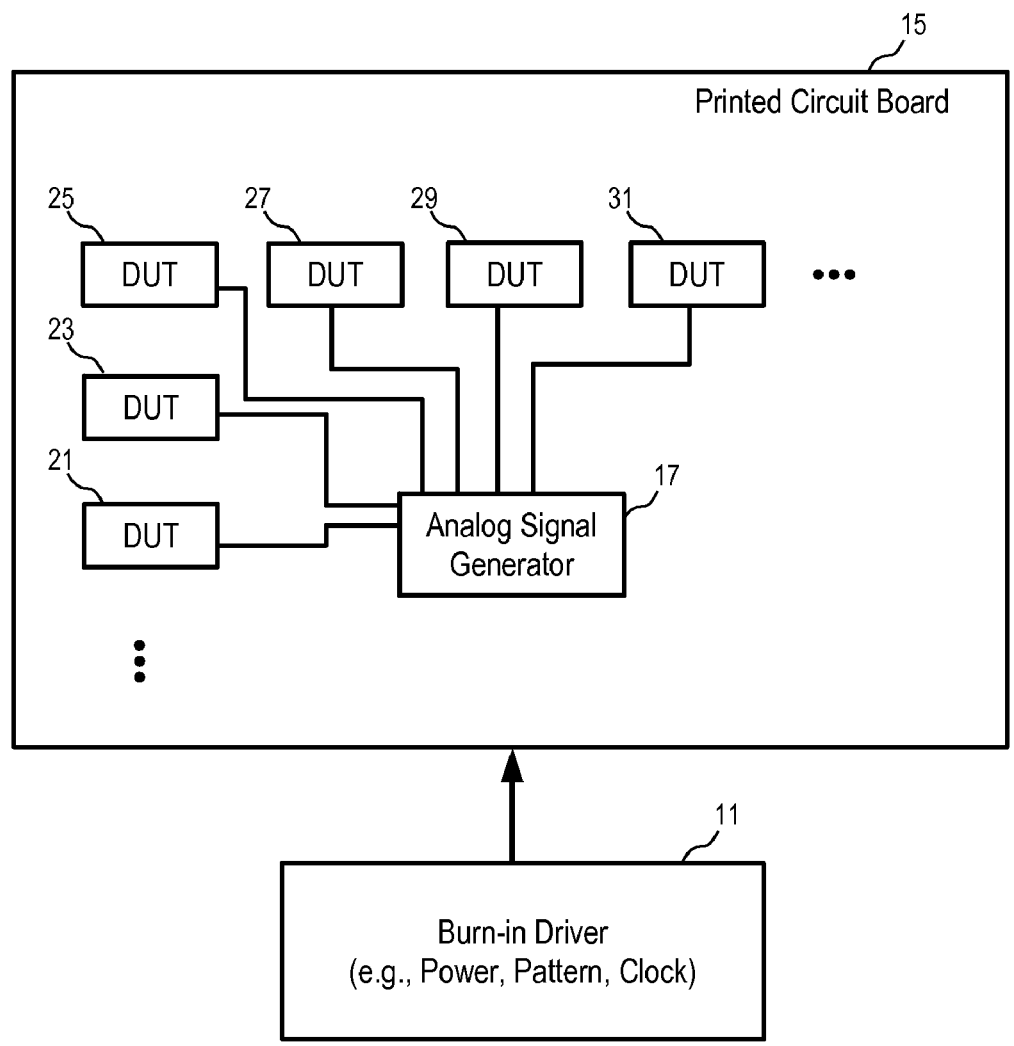
FIG. 1 shows a printed circuit board for dynamic burn-in tests according to one embodiment of the invention.

FIG. 1 shows a printed circuit board for dynamic burn-in tests according to one embodiment of the invention. In FIG. 1, a printed circuit board 15 is used to carry a plurality of Devices under Test (DUTs) (e.g., 21-31), such as semiconductor devices, IC chips. The printed circuit board 15 is designed to support the Devices under Test (DUTs) in a burn-in chamber during the burn-in process. Thus, the printed circuit board 15 can also be called a burn-in board. In one embodiment, the printed circuit board 15 contains sockets to accept the IC chips in a removable way. The printed circuit board 15 further contains traces to deliver power and clock signals that are supplied by the burn-in driver 11 to the Devices under Test (DUTs). To facilitate a dynamic burn-in process, the burn-in driver further provides a digital input pattern that serves as the input stimuli for the dynamic burn-in of the (digital circuitry of) semiconductor devices.

In one embodiment, the burn-in driver 11 is located outside of the burn-in chamber during the burn-in process. Alternatively, the burn-in driver 11 may be partially in the burn-in chamber and partially outside of the burn-in chamber. For example, the power supply and the clock signals may be provided from outside of the burn-in chamber; and the pattern generator is inside the burn-in chamber during the burn-in process. In one embodiment, the pattern generated is implemented on the printed circuit board 15.

In FIG. 1, an analog signal generator 17 is implemented on the printed circuit board to provide high frequency signals for a receiver part of the Devices under Test (DUTs). A frequency of the signal is above 20 Megahertz, from several hundred Megahertz to several Gigahertz. For example, the analog signal generator 17 provides an analog RF signal for each of the Devices under Test (DUTs) on the printed circuit board 15. The RF signal may be frequency modulated or amplitude modulated to provide varying input to the Devices under Test (DUTs). In one embodiment, the modulation of the RF signals is controlled by the signals received from the burn-in driver 11.

Figure 2:
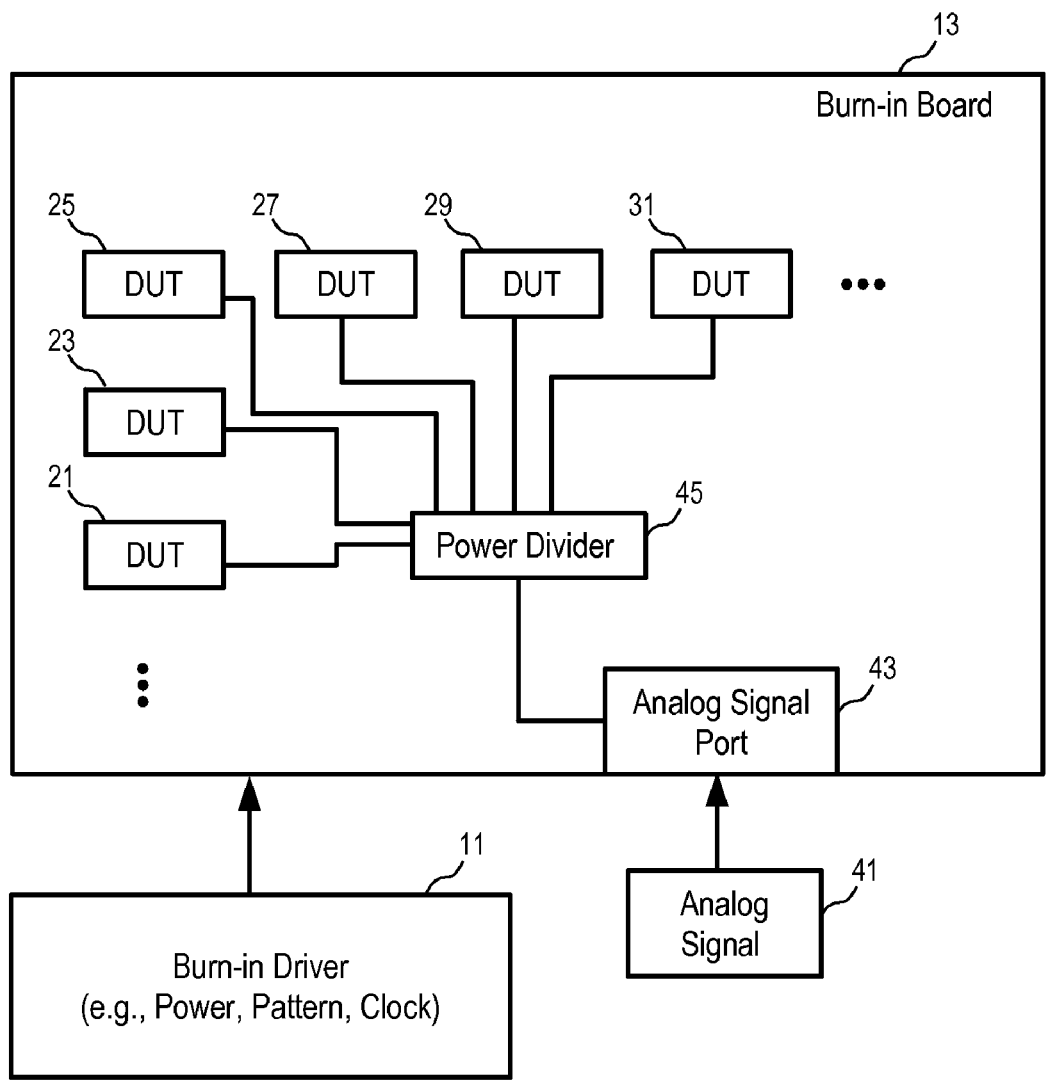
FIGS. 2-4 show burn-in boards according to some embodiments of the invention.
Figure 3:
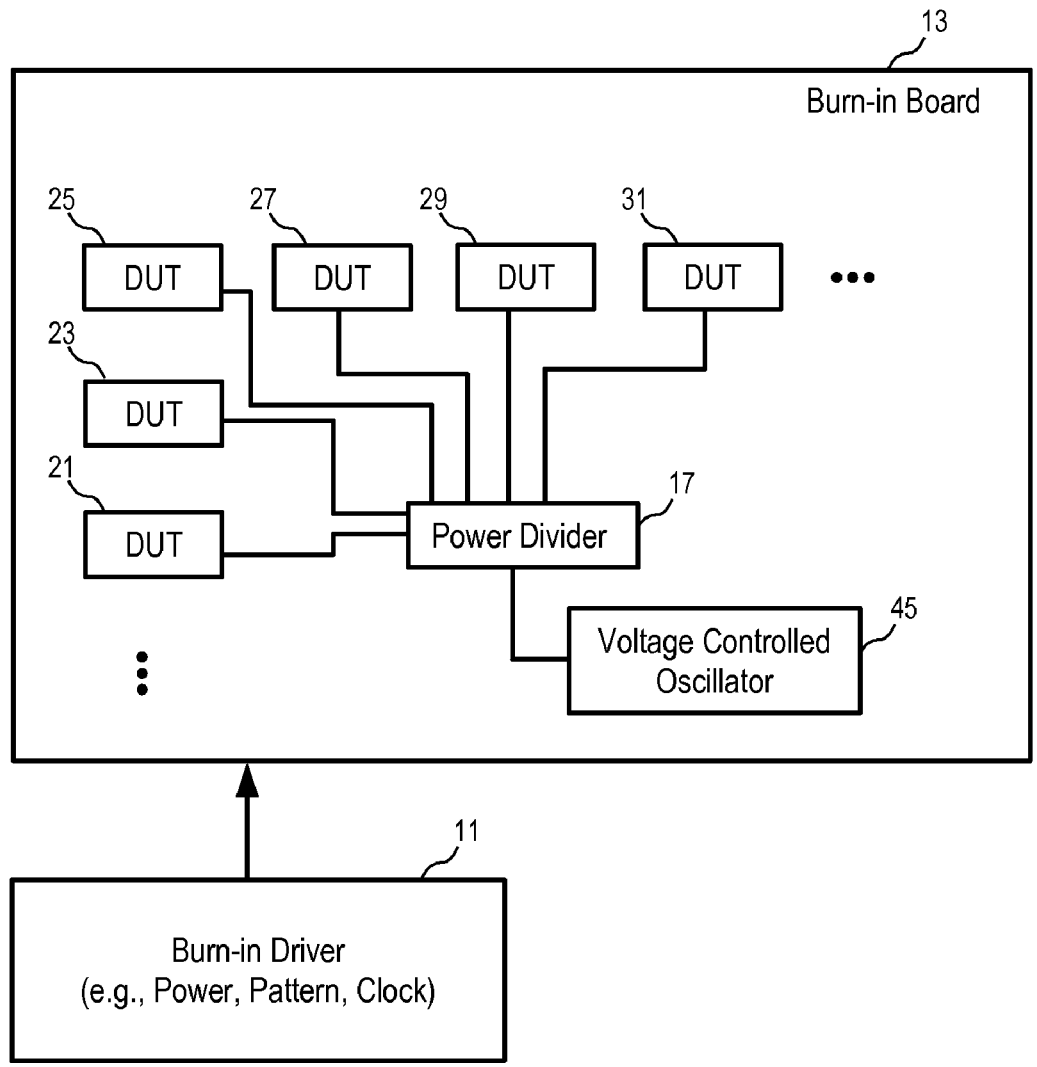
Figure 4:
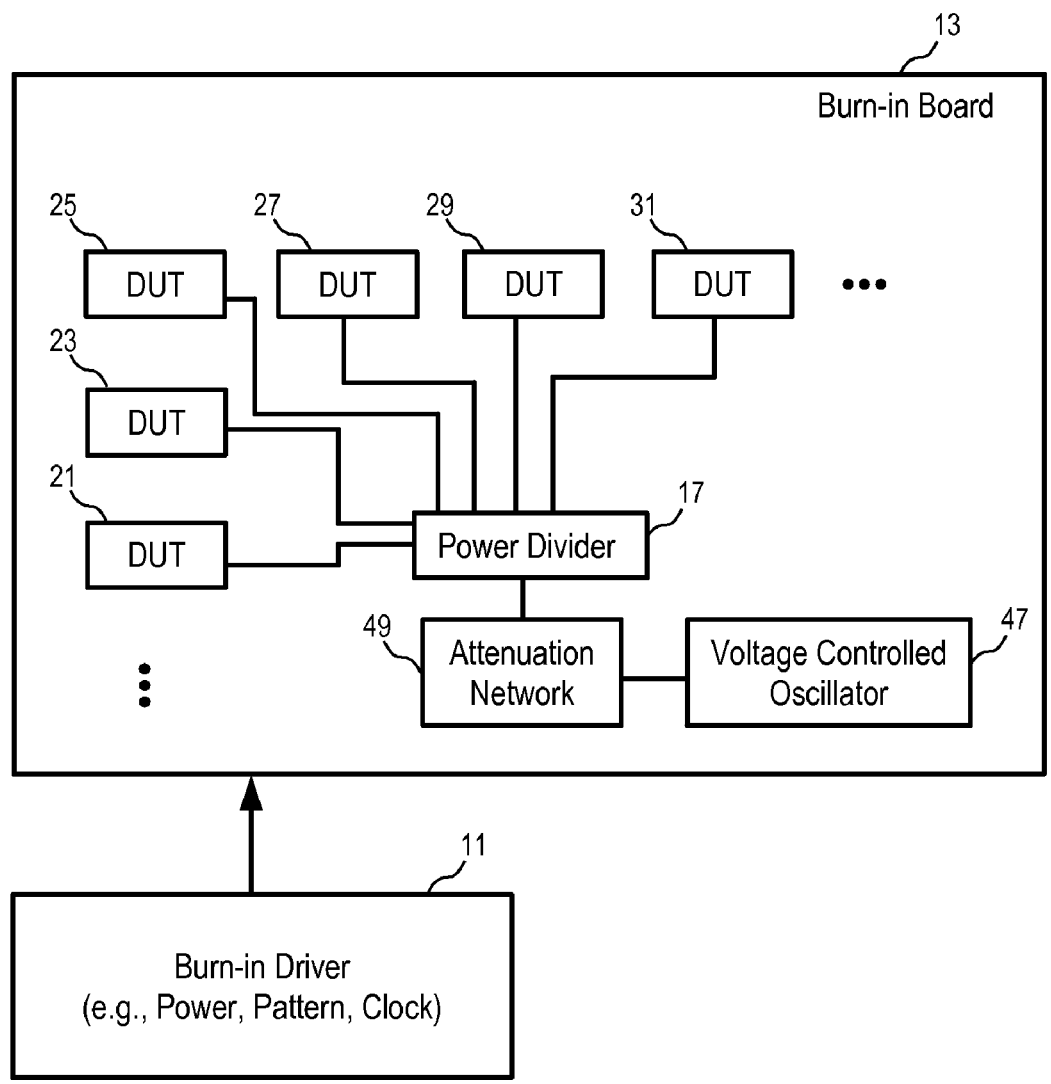

FIGS. 2-4 show burn-in boards according to some embodiments of the invention.

In FIG. 2, an analog signal port 43 is used to receive an analog signal 41 from a source. Preferably, the source is located inside the burn-in chamber during the burn-in process. The analog signal port 43 is coupled to a power divider 45, which splits the analog signal into a plurality of signals for the plurality of Devices under Test (DUTs), respectively.

In one embodiment, the power divider 45 is a multi-stage N-port Wilkinson power divider. More information on Wilkinson power divider can be found in E. J. Wilkinson, "An N-way hybrid power divider," IRE Trans. Microwave Theory Tech., vol. MTT-8, pp. 116-118, 1960, and Jong-Sik Lim, Sung-Won Lee, et al, "A 4:1 Unequal Wilkinson Power Divider", IEEE MICROWAVE AND WIRELESS COMPONENTS LETTERS, VOL. 11, NO. 3, 2001. Typically, an equal Wilkinson Power Divider is used to provide equal analog signals to the Devices under Test (DUTs).

Since a Wilkinson power divider can be implemented using several small components, the space needed on the burn-in board for the power divider is small and has no impact on the density of Devices under Test (DUTs) on the burn-in board.

In one embodiment, an analog signal source is mounted on the burn-in board 13, as illustrated in FIG. 3. A voltage controlled oscillator (VCO) is used to generate the high frequency signal source, which is divided by the power divider 45 for the plurality of Devices under Test (DUTs) on the burn-in board. Implementing the high frequency signal source on the burn-in board minimizes the distance for delivering the analog signal and thus the interference and crosstalk.

In one embodiment, an attenuation network 49 is used to control the amplitude of the analog signal, as illustrated in FIG. 4. In one embodiment, the frequency of the output of the Voltage Controlled Oscillator (VCO) is adjustable via a control voltage applied to the Voltage Controlled Oscillator (VCO) 47; and the amplitude of the analog signal provided to the power divider 45 is adjustable via another control voltage applied to the attenuation network 49. The control voltages are provided by the burn-in driver 11.

Figure 5:
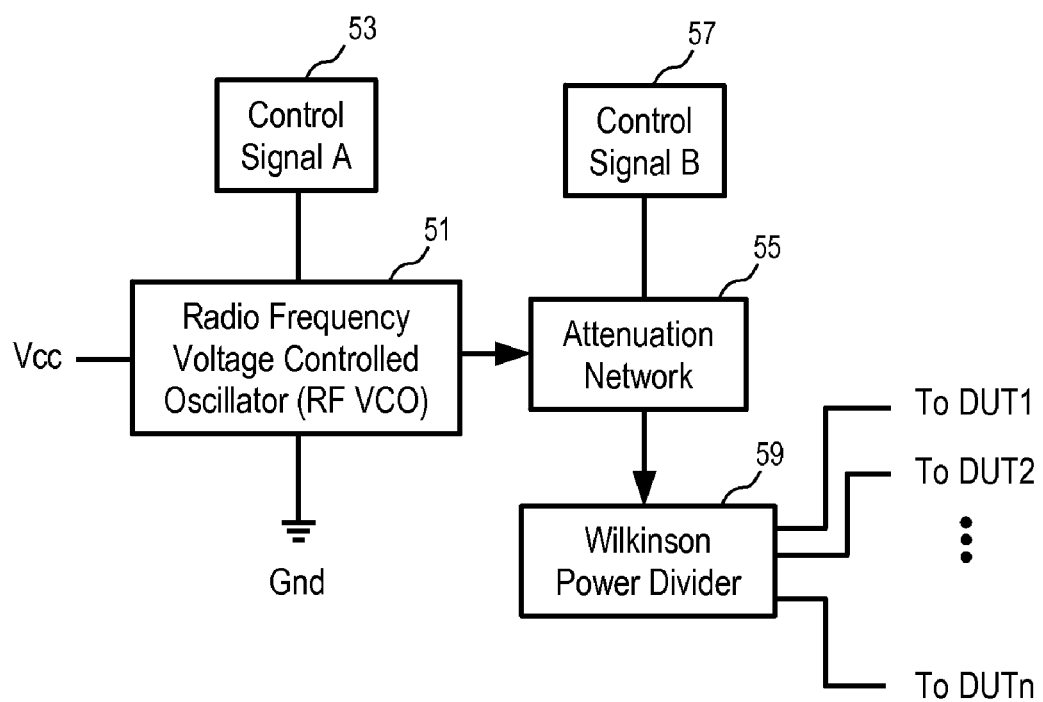
FIG. 5 shows a block diagram of a signal generator for a burn-in board according to one embodiment of the invention.
Figure 6:
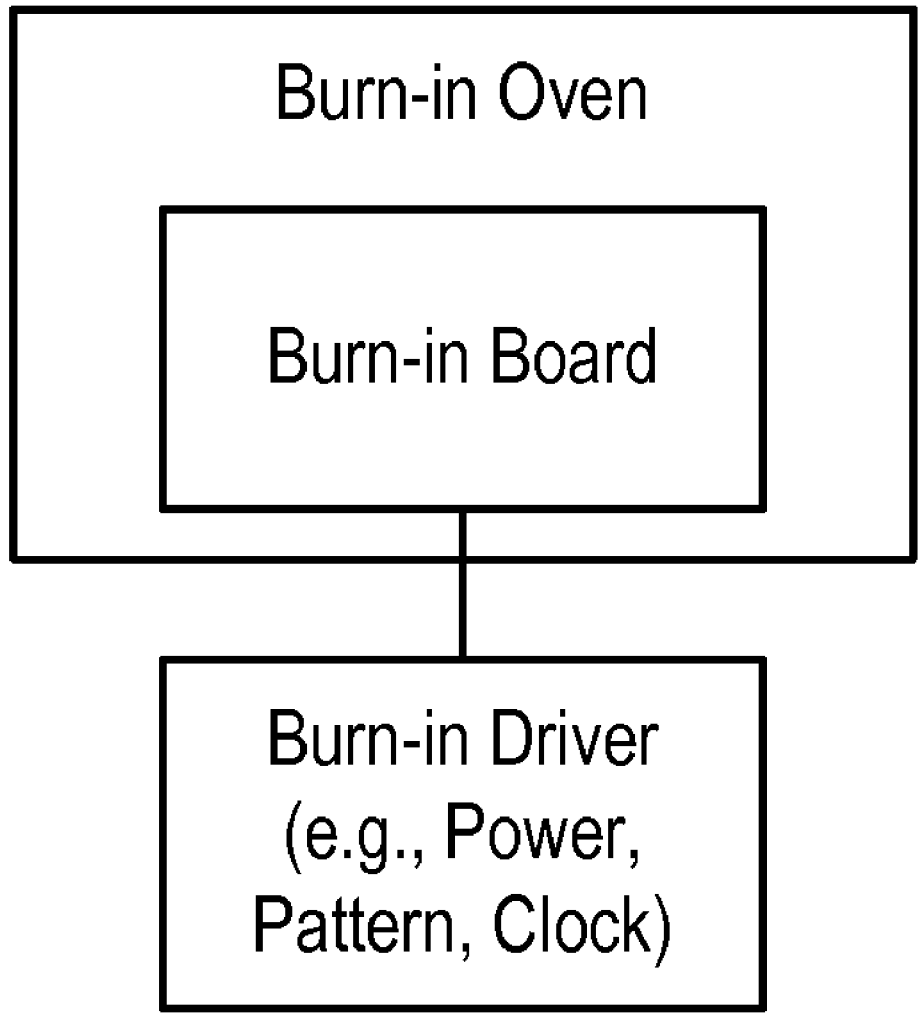
FIG. 6 shows a system according to one embodiment.

FIG. 5 shows a block diagram of a signal generator for a burn-in board according to one embodiment of the invention. In FIG. 5, the signal generator includes a Radio Frequency Voltage Controlled Oscillator (RF VCO) 51, an attenuation network 55 and a Wilkinson power divider 59.

The Radio Frequency Voltage Controlled Oscillator (RF VCO) 51 generates a high frequency signal. The frequency of the signal is controlled by the control signal A 53. The frequency of the signal can be above 500 Megahertz. In one implementation, when the voltage of the control signal is adjusted in the range between 0V and 5V, the frequency of the output signal of the Radio Frequency Voltage Controlled Oscillator (RF VCO) 51 changes between 900 Megahertz and 1100 Megahertz.

In one embodiment, the control signal A 53 is provided to the signal generator from outside of the burn-in chamber via a wire (e.g., a test channel connecting the burn-in driver 11 to the burn-in board 15). In one embodiment, the voltage of the control signal is adjustable to modulate the frequency of the output of the Radio Frequency Voltage Controlled Oscillator (RF VCO) 51.

In one embodiment, a digital to analog converter is used to convert a digital signal into the control signal A 53. Thus, a test pattern for the frequency modulation of the output of the Radio Frequency Voltage Controlled Oscillator (RF VCO) 51 can be generated based on the computation of a digital circuitry.

The attenuation network 55 is used to adjust the output of the Radio Frequency Voltage Controlled Oscillator (RF VCO) 51 to a desired level. In one embodiment, a Pi style resistive attenuator is used. In one embodiment, the attenuation of the network is controllable via the control signal B 57. In one embodiment, the amplitude of the output of the Frequency Voltage Controlled Oscillator (RF VCO) 51 is modulated via varying the voltage of the control signal B 57. In another embodiment, the amplitude of the output of the Frequency Voltage Controlled Oscillator (RF VCO) 51 is controlled but not actively modulated.

In one embodiment, the control signal B 57 is provided to the signal generator from outside of the burn-in chamber via a wire (e.g., a test channel connecting the burn-in driver 11 to the burn-in board 1). In one embodiment, a digital to analog converter is used to convert a digital signal into the control signal B 57. Thus, a test pattern for the amplitude modulation of the output of the Radio Frequency Voltage Controlled Oscillator (RF VCO) 51 can be generated based on the computation of a digital circuitry.

In other embodiments, the voltages of the control signal 53 and/or the control signal 57 are generated within the burn-in chamber using a separate driver board, or using a circuitry mounted on the burn-in board.

The Wilkinson power divider 59 splits the output of the attenuation network 55 into a plurality of equal (or unequal) signals for the Devices under Test (DUTs) on the burn-in board.

Since the Radio Frequency Voltage Controlled Oscillator, the attenuation network and the Wilkinson power divider can be implemented using a small number of readily available components, the cost of implementing the signal generator is very low. Thus, the scheme is very economical in manufacturing cost and component cost.

One advantage of the on-board design of the signal generator is that the distortion due to the transmission from the signal generator to the Devices under Test (DUTs) is reduced to improve the signal integrity for every Device under Test (DUT) on the burn-in board even in Gigahertz frequency level. In addition, since the RF VCO and the power splitter are part of the burn-in board, it's easy to perform trouble shooting in case that RF circuits do not work properly.

In one embodiment, when the RF VCO and Wilkinson power divider are implemented on the burn-in board, existing burn-in systems in the market can be used for RF dynamic burn-in test without further modifications and without the need for an off chamber high-frequency signal generator. Since the Wilkinson power divider is used, one RF VCO can be used to drive a group of Devices under Test. Since the frequency and/or the amplitude of the signal source are adjustable, the system is flexible for different applications.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An apparatus, comprising:
a burn-in board to carry a plurality of semiconductor devices inside a burn-in oven and to receive a digital signal via a wired connection from a burn-in driver located outside the burn-in oven, the burn-in board comprising a printed circuit to distribute the digital signal to a digital processing part of each of the plurality of semiconductor devices; and
a radio frequency signal generator mounted on the burn-in board to provide a plurality of analog radio frequency signals, the printed circuit to connect each of the analog radio frequency signals to a receiver part of a corresponding one of the plurality of semiconductor devices separately from distributing the digital signal to the digital processing part of each of the plurality of semiconductor devices.

2. The apparatus of claim 1, wherein the apparatus further comprises an digital to analog converter to receive a second digital signal from the burn-in drive and to generate a control signal to frequency modulate an analog signal; and the radio frequency signal generator comprises a Wilkinson power divider to divide the analog signal to generate the plurality of analog radio frequency signals.

3. The apparatus of claim 2, wherein the radio frequency signal generator further comprises a voltage controlled oscillator.

4. The apparatus of claim 3, wherein the voltage controlled oscillator is controllable according to an input signal to adjust frequency of an output of the radio frequency signal generator.

5. The apparatus of claim 3, wherein the Wilkinson power divider splits a radio frequency signal generated by the voltage controlled oscillator into the plurality of radio frequency signals.

6. The apparatus of claim 5, wherein the radio frequency signal generator further comprises an attenuation network;

the attenuation network attenuates a radio frequency signal received from the voltage controlled oscillator to provide an attenuated radio frequency signal to the Wilkinson power divider.

7. The apparatus of claim 5, wherein the plurality of radio frequency signals have equal power.

8. The apparatus of claim 2, further comprising a port to receive a radio frequency signal wherein the Wilkinson power divider splits the radio frequency signal received from the port into the plurality of radio frequency signals.

9. The apparatus of claim 2, wherein the radio frequency signal generator further comprises an attenuation network; the attenuation network provides an attenuated radio frequency signal to the Wilkinson power divider.

10. The apparatus of claim 9, wherein the attenuation network is controllable according to an input signal to adjust amplitude of the attenuated radio frequency signal.

11. The apparatus of claim 1, wherein the plurality of semiconductor devices comprise a plurality of integrated circuits; and the burn-in board comprise a plurality of sockets to removably receive the plurality of integrated circuits.

12. An apparatus, comprising:
a burn-in board comprising a printed circuit to carry a plurality of semiconductor devices inside a burn-in oven and to receive a digital signal via a wired connection from a burn-in driver located outside the burn-in oven, the printed circuit to distribute the digital signal to a digital processing part of each of the plurality of semiconductor devices; and
a power divider mounted on the burn-in board to split an analog signal into a plurality of analog input signals, the printed circuit to connect each of the plurality of analog input signals to a receiver part of a corresponding one of the plurality of semiconductor devices separately from distributing the digital signal to the digital processing part of each of the plurality of semiconductor devices.

13. The apparatus of claim 12, wherein the apparatus further comprises an digital to analog converter to receive a second digital signal from the burn-in drive and to generate a control signal to frequency modulate the analog signal.

14. The apparatus of claim 12, wherein power divider is an equal Wilkinson power divider.

15. The apparatus of claim 12, further comprising a voltage controlled oscillator (VCO) based signal generator mounted on the printed circuit board to generate the analog signal.

16. The apparatus of claim 15, wherein at least one of frequency and amplitude of the analog signal is controllable via one or more digital signals.

17. An apparatus, comprising:
a burn-in oven;
a burn-in driver disposed outside the burn-in oven to provide a first digital signal;
a burn-in board disposed inside the burn-in oven and coupled to the burn-in driver to receive the first digital signal via a wired connection, the burn-in board comprising a printed circuit to carry a plurality of semiconductor Devices Under Test (DUTs) and to distribute the first digital signal to a digital processing part of each of the DUTs;
a voltage controlled oscillator (VCO) mounted on the printed circuit to provide an analog signal to a receiver part of each of the DUTs; and
an digital to analog converter to receive a second digital signal from the burn-in drive and to generate a control signal to frequency modulate the analog signal generated by the VCO.

18. The apparatus of claim 17, wherein the analog signal has a frequency above 500 Megahertz.

19. The apparatus of claim 18, further comprising a Wilkinson power divider to equally divide the analog signal for inputting to the plurality of DUTs.

20. The apparatus of claim 19, wherein each of the DUTs comprises an integrated circuit (IC).

* * * * *